US009362481B2

(12) United States Patent
Yu et al.

(10) Patent No.: US 9,362,481 B2
(45) Date of Patent: Jun. 7, 2016

(54) CONTINUOUS PIEZOELECTRIC FILM INCLUDING POLAR POLYMER FIBERS

(71) Applicants: Michael Yu, Timonium, MD (US); Kailiang Ren, Lutherville, MD (US); James E. West, Plainfield, NJ (US)

(72) Inventors: Michael Yu, Timonium, MD (US); Kailiang Ren, Lutherville, MD (US); James E. West, Plainfield, NJ (US)

(73) Assignee: The Johns Hopkins University, Baltimore, MD (US)

( * ) Notice: Subject to any disclaimer, the term of this patent is extended or adjusted under 35 U.S.C. 154(b) by 283 days.

(21) Appl. No.: 13/785,767

(22) Filed: Mar. 5, 2013

(65) Prior Publication Data
US 2013/0229091 A1    Sep. 5, 2013

Related U.S. Application Data

(60) Provisional application No. 61/606,600, filed on Mar. 5, 2012.

(51) Int. Cl.
*H01L 41/09*    (2006.01)
*H01L 41/193*    (2006.01)
*H01L 41/333*    (2013.01)
*H01L 41/113*    (2006.01)

(52) U.S. Cl.
CPC .......... *H01L 41/193* (2013.01); *H01L 41/1132* (2013.01); *H01L 41/333* (2013.01)

(58) Field of Classification Search
CPC .............. D01F 1/10; C08J 5/18; B32B 27/08; B32B 27/32; B32B 27/00; C08L 23/0815; D04H 11/08; B29C 59/025; B29C 55/00; D01D 5/08

USPC ......................................................... 310/800
See application file for complete search history.

(56) References Cited

U.S. PATENT DOCUMENTS

| 2,486,560 | A | 11/1949 | Gray |
| 2,708,244 | A | 5/1955 | Jaffe |
| 5,298,602 | A | 3/1994 | Shikinami et al. |
| 5,334,903 | A * | 8/1994 | Smith ........................... 310/358 |
| 5,494,617 | A | 2/1996 | Iwamoto |
| 7,045,075 | B2 | 5/2006 | Kasukawa et al. |
| 7,101,491 | B2 | 9/2006 | Nonoyama et al. |
| 8,946,974 | B2 * | 2/2015 | Yu et al. ........................ 310/358 |

(Continued)

FOREIGN PATENT DOCUMENTS

| JP | 7-327297 A | 12/1995 |
| JP | 2001-282140 A | 10/2001 |

(Continued)

OTHER PUBLICATIONS

Ando, E. Fukada, J. Polym. Sci. Pol. Phys. 14, 63-79 (1976).

(Continued)

*Primary Examiner* — Thomas Dougherty
(74) *Attorney, Agent, or Firm* — Venable LLP; Henry J. Daley; David M. Klecyngier

(57) ABSTRACT

A continuous piezoelectric film can include a plurality of fibers, each fiber including a polypeptide, wherein molecules of the polypeptide have electric dipole moments that are aligned such that the piezoelectric fiber provides a piezoelectric effect. The continuous piezoelectric film has at least one piezoelectric constant $d_{31}$ or $d_{33}$ that is at least 1 pC/N. The continuous piezoelectric film can be prepared hot pressing a mat of aligned piezoelectric fibers.

12 Claims, 8 Drawing Sheets

Layer 1: electrospun fiber

Layer 2: corona treated film

Layer 3: electrospun fiber

(56) References Cited

U.S. PATENT DOCUMENTS

| | | | |
|---|---|---|---|
| 2006/0057377 A1* | 3/2006 | Harrison et al. | 428/364 |
| 2006/0198760 A1 | 9/2006 | Potyrailo et al. | |
| 2007/0200460 A1 | 8/2007 | Scott | |
| 2008/0217465 A1* | 9/2008 | Facciano et al. | 244/3.1 |
| 2011/0260584 A1 | 10/2011 | Yu et al. | |
| 2012/0025674 A1* | 2/2012 | Yoshida et al. | 310/365 |

FOREIGN PATENT DOCUMENTS

| | | |
|---|---|---|
| WO | WO-2008005820 A2 | 1/2008 |
| WO | WO-2008/021191 A2 | 2/2008 |
| WO | WO-2009013376 A1 | 1/2009 |
| WO | WO-2010/022158 A2 | 2/2010 |
| WO | WO-2010104196 A1 | 9/2010 |

OTHER PUBLICATIONS

Bergman, J.H. McFee, G.R. Crane, Appl. Phys. Lett. 18, 203-205 (1971).
Campagnola et al., Biophys. J. 82, 493-508 (2002).
Chang et al., J. Chem. Phys. 111, 6136-6143 (1999).
Deming et al. (Facile synthesis of block copolypeptides of defined architecture. Nature, 1997, 390: p. 386-389.
Eizuka, Biochim. Biophys. Acta. 175, 457 (1969).
Farrar, J.E. West, I.J. Busch-Vishniac, S.M. Yu, Scripta Mater. 59, 1051-1054 (2008).
Farrar et al., Adv. Mater. 23, 3954-3958, Jul. 2011.
Fukada, Ferroelectrics 60, 285-296 (1984).
Fukada, I. Yasuda, J. Phys. Soc. Jpn. 12, 5 (1957).
Fukada, J. Phys. Soc. Jpn. 10, 149-154 (1955).
Fukada, J. Phys. Soc. Jpn. 11, 1301 (1956).
Fukada et al., J. Macromol, Sci.-Phys. B 8, 475481 (1973).
Fukuto et al., J. Chem. Phys. 119, 6253-6270 (2003).
Furukawa et al., Ferroelectrics 32, 61-67 (1981).
Furukawa, IEEE T Electr. Insul. 24, 375-394 (1989).
Furukawa, K. Ogiwara, E. Fukada, J. Polym. Sci. Pol. Phys. 18, 1697-1706 (1980).
Go, S. Ejiri, E. Fukada, BBA-Protein Struct. M. 175, 454-456 (1969).
Kawai, The Piezoelectricity of Poly(vinylidene Fluoride). Jpn. J. Appl. Phys., 1969. 8: p. 975.
Konaga, E. Fukada, J. Polym. Sci. Pol. Phys. 9, 2023 (1971).
Murthy, E. T. Samulski, J.R. Knox, Macromolecules 19, 941-942 (1986).
Nakiri et al., Jpn. J. Appl. Phys. 43, 6769-6774 (2004).
Nakiri et al., Jpn. J. Appl. Phys. 44, 7119-7122 (2005).
Narniki, R. Hayakawa, Y. Wada, J. Polym. Sci. Pol. Phys. 18, 993-1004 (1980).
Neese et al., J. West, Appl. Phys. Left. 90, 3 (2007).
Ren, Y.M. Liu, H. Hofmann, Q.M. Zhang, J. Blottman, Appl. Phys. Lett. 91, 3 (2007).
Sessler et al., Self-Based Conderser Microphone with High Capacitance. J. Acoust. Soc. Am., 1962, 34: p. 1787.
Worley, R.W. Linton, E.T. Samulski, Langmuir 11, 3805-3810 (1995).
Yu et al., Nature 389, 167-170 (1997).
Zhang et al., Electroactive Polymer (EAP) Actuators as Artificial Muscles, vol. 2, (SPIE Press, WA, USA 2004, Chapter 4).
Barroca et al., "Protein adsorption on piezoelectric poly(L-lactic) acid thin films by scanning probe microscopy," Applied Physics Letters, vol. 98, Iss. 13, 133705, Mar. 2011.
Fukada, "Recent developments of polar piezoelectric polymers," IEEE Transactions on Dielectrics and Electrical Insulation, vol. 13, pp. 1110-1119, 2006.
Kryszewski, "Fifty years of study of the piezoelectric properties of macromolecular structued biological materials," Acta Pyhsica Polonica A, vol. 105, p. 389, 2004.
Lang et al., "Review of some lesser-known applications of piezoelectric and pyroelectric polymers." Applied Physics A: Material Science and Processing 85 (2), pp. 125-134, 2006.
Tajitsu et al., "Piezoelectric poly-L-lactic acid film prepared by a new method," Japanese Journal of Applied Physics, Part 1: Regular Papers and Short, vol. 42, pp. 6172, 2003.
Teferi et al., "Magnetoelectric coupling in multiferroic heterostructure of rf-sputtered NiMnGa thin film on PMNPT," J. Magn. and Magnetic Materials, vol. 324, pp. 1882-1886, Jun. 2012.
Benjamin, (2002) Recent Advances in 1-3 Piezoelectric Polymer Composite Transducer Technology for AUV/UUV Acoustic Imaging Applications. J. Electroceramics, vol. 8, pp. 145-154.
Fleury et al., (1996) Improvements of Ultrasonic Inspections through the Use of Piezo-Composite Transducers (translated into english from the original paper—May 1995). Transducer Workshop, NDTnet, vol. 1, No. 09.
Gerhard-Multhaupt, R. (2002) Voided polymer electrets—New materials, new challenges, new chances. 11th International Symposium on Electrets, pp. 36-45.
Honda et al., (2008) Electrically Controlled Piezoelectric Motion of Piezoelectric Chiral Polymeric Fibers. Japanese Journal of Applied Physics, vol. 47, No. 9, pp. 7642-7645.
Honda et al., (2007) Piezoelectricity of Chiral Polymeric Fibers. Japanese Journal of Applied Physics, vol. 46, No. 10B, pp. 7122-7124.
Minato et al., (2006) Chain Conformations of Poly(y-benzyl-L-glutamate) Pre and Post an Electrospinning Process. Macromolecular Bioscience, vol. 6, pp. 487-495.
Tajitsu et al., (2004) Microactuators with Piezoelectric Polylactic Acid Fibers—Toward the Realization of Tweezers for Biological Cells. Taylor & Francis, vol. 304, pp. 195-200.
Tajitsu et al., (2008) Piezoelectricity of Chiral Polymeric Fiber and Its Application in Biomedical Engineering, IEEE Transactions on Ultrasonics, Ferroelectrics, and Frequency Control, vol. 55, No. 5, pp. 1000-1008.

\* cited by examiner

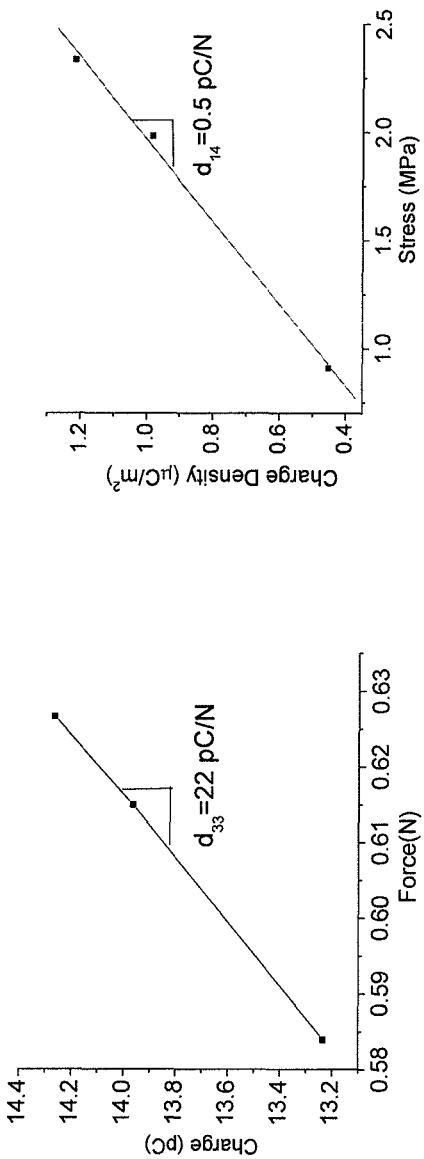
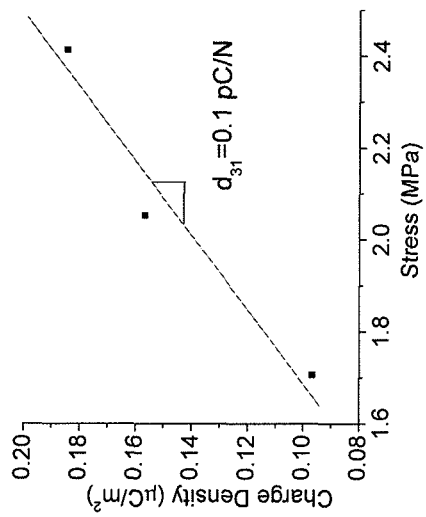
Fig. 9a
Fig. 9b
Fig. 9c

CONTINUOUS PIEZOELECTRIC FILM INCLUDING POLAR POLYMER FIBERS

CROSS-REFERENCE TO RELATED APPLICATIONS

This application claims priority to U.S. Provisional Application No. 61/606,600 filed Mar. 5, 2012, the entire contents of which are hereby incorporated by reference.

STATEMENT OF GOVERNMENT SUPPORT

This invention was made with government support under N000140610961 awarded by the Office of Naval Research. The government has certain rights in the invention.

TECHNICAL FIELD

The present invention relates to a continuous piezoelectric film including polar polymer fibers, articles comprising the films, methods for making the films, and electronic devices using the films.

BACKGROUND

Piezoelectricity refers to a phenomenon observed in some materials in which imposition of a stress will establish an electric field whose intensity is proportional to the stress level. Jacques and Pierre Curie discovered piezoelectricity in quartz in 1880; but the materials most often used today as piezoelectrics are barium titanate ($BaTiO_3$) and lead zirconate titanate (PZT). Both are ceramic materials which require high temperature processing in the presence of a high electric field to render them piezoelectric. They tend to be expensive and brittle materials. (See Rosen, C. Z., B. V. Hiremath, and R. E. Newnham, eds. *Piezoelectricity*. 1992, American Institute of Physics: New York for a review of piezoelectricity.)

Piezoelectric materials exhibit a linear coupling between a stress field and an electric field. Piezoelectricity occurs when a mechanical field induces an electrical field, or vice versa. Generally, transduction from a mechanical signal to an electrical signal is referred to as sensing, whereas transduction using electrical input to produce a mechanical output is referred to as actuation. In order to fully investigate piezoelectric materials, both sensing and actuation should be considered, because some measurements are easier to make on sensors and others on actuators.

$BaTiO_3$ and PZT were first discovered in the late 1940s and early 1950s (Jaffe, B. 1955: U.S. Pat. No. 2,708,244, issued May 10, 1955; Gray, R. B. 1949: U.S. Pat. No. 2,486,560, issued Nov. 1, 1949). Efforts since then to find new piezoelectric materials generally have met with disappointment. The most promising development was the discovery of piezoelectricity in PVDF, but this polymer loses its piezoelectricity at a relatively low temperature (70° C.) and requires uniaxial or biaxial stretching in order to introduce piezoelectricity (Kawai, H., *The Piezoelectricity of Poly(vinylidene Fluoride)*. Jpn. J. Appl. Phys., 1969. 8: p. 975). Mechanical fatigue is also a problem with PVDF. Few commercial products using piezoelectric PVDF have been marketed, although the military has employed thick PVDF hydrophones.

Piezoelectricity can be observed in polypropylene foam, often referred to as LDPP for low density polypropylene. (See Gerhard-Multhaupt, R. *Voided polymer electrets—New materials, new challenges, new chances*. in 11*th International Symposium on Electrets*. 2002 for a review.) LDPP is produced in a blow-extrusion process that results in polypropylene with closed cell spherical voids. The material is then biaxially stretched to produce disk-shaped voids. It is exposed to corona charging at levels of about 20 kV that cleaves the molecular bonds of the gas trapped in the voids yielding a $d_{33}$ of up to 300 pC/N. LDPP has some inherent problems that limit its utility. First, it loses its piezoelectric function starting at about 50° C. This means that the material is inappropriate for any use that will cause significant warming (potentially any operation in air, for instance). Second, at high pressures, it is likely that the relatively low stiffness of the air voids compared to the polymer will result in collapse of the voids, possibly with discharging. Thus it is not appropriate for high pressure use.

Composites formed by placing a piezoelectric material in a polymer matrix have also been pursued successfully for many years. The bulk of the work has been on 1-3 composites, in which rods of piezoelectric materials (PZT or $BaTiO_3$) are embedded in a polymer matrix. Applications of piezoelectric 1-3 composites have focused on sonar although there has been increasing interest in their use for nondestructive evaluation of structures and acoustic monitoring of faults in the nuclear industry (Fleury, G. and C. Gondard, *Improvements of Ultrasonic Inspections through the Use of Piezo-Composite Transducers*. Transducer Workshop, 1996). Compared to the standard piezoelectric materials, 1-3 composites are lower in mass and more rugged. Volume fractions of the ceramic component vary from 0-50% with thicknesses ranging from fractions of a millimeter to 25 millimeters (Benjamin, K., *Recent Advances in 1-3 Piezoelectric Polymer Composite Transducer Technology for AUV/UUV Acoustic Imaging Applications*. J. Electroceramics, 2002. 8: p. 145). The material typically is produced using an injection molding process to produce ceramic rods in a pattern with a plate structure at one end to keep the rod spacing and alignment fixed. A polymer then fills the regions between the rods, and the plate end is sliced off.

Piezoelectric materials are the key components of electromechanical transducers (sensors and actuators) for automatic control systems, and measurement and monitoring systems. Electromechanical transducers can be found in items ranging from hearing aids to automobiles, from clothing dryers to perimeter sensors, and from elevators to computers. The history of transduction reads like a timeline for materials invention with each new coupling mechanism discovery leading to new devices (Busch-Vishniac, I. J., *Electromechanical Sensors and Actuators*. 1999, New York: Springer).

The most common acoustic transducers are microphones and loudspeakers. They are found in every telephone, in tape and digital audio recorders, and increasingly in automobiles, where they are being used for hands-free communication and in monitoring engine performance. Today, most common microphones are electret microphones. Electret materials are those which exhibit a permanent polarization or space charge. First reported in 1962 (Sessler, G. M. and J. E. West, *Self-Based Conderser Microphone with High Capacitance*. J. Acoust. Soc. Am., 1962. 34: p. 1787), electret microphones use a membrane suspended under tension above a rigid backplate, a perforated backplate and back cavity to reduce stiffness, and a small hole through the structure for dc pressure equalization.

By contrast, a piezoelectric microphone can be much simpler in structure. The piezoelectric material serves as the dielectric element, with a metal surface on top and bottom. It is unnecessary to supply any tension, to vent the device, or to provide a back cavity and perforated backplate. The result is a very simple microphone in which the material is contained either in a ring allowing sound access from both sides (a gradient microphone) or in a cylinder closed at one end (conventional pressure microphone). While it is possible to make piezoelectric microphones from BaTiO$_3$ and PZT, they are generally less sensitive and more expensive than electret microphones.

SUMMARY

Piezoelectric fibers including organic polymers which have permanent, aligned dipole moments can be fused into a continuous piezoelectric film by a simple, inexpensive hot press method. The method eliminates the need for mechanical stretching and/or corona charging. Continuous films made from of poly(glutamate) fibers show piezoelectricity not only in the $d_{14}$ shear mode, but also in $d_{31}$ and $d_{33}$ modes.

In one aspect, a continuous piezoelectric film includes a plurality of fibers, each fiber including a polypeptide, wherein molecules of the polypeptide have electric dipole moments that are aligned such that the piezoelectric fiber provides a piezoelectric effect, and where the continuous piezoelectric film has at least one piezoelectric constant $d_{31}$ or $d_{33}$ that is at least 1 pC/N.

The electric dipole moments can be aligned parallel to the axis of the fiber. The plurality of fibers can be aligned in parallel. The continuous piezoelectric film can have $C_{\infty v}$ symmetry. The continuous piezoelectric film can consist essentially of the plurality of fibers. The plurality of fibers can be fused.

The piezoelectric film can have at least one piezoelectric constant $d_{31}$ and $d_{33}$ that is at least 10 pC/N. The piezoelectric film can have an operating temperature in the range of about 4° C. to 80° C.

The polypeptide can have a helical structure. The polypeptide can include repeating residues of γ-esters of glutamic acid, β-esters of aspartic acid, alanine, phenylalanine, or combinations thereof.

In another aspect, a method of making a continuous piezoelectric film, includes electrospinning a polymer solution to form a fiber, where the molecules of the polymer have electric dipole moments that are aligned; winding the fiber onto a rotating target, where the rotating target is electrically grounded; collecting a mat including a plurality of the fibers; and hot pressing the mat at a pressure and temperature and for a time, thereby fusing the fibers together to form a continuous film.

The pressure can be between about 500 lbs stress and about 5,000 lbs stress. The temperature can be greater than 50° C. The time can be between 1 min and 100 min. The plurality of fibers can be aligned in parallel. The resulting continuous piezoelectric film can have $C_{\infty v}$ symmetry.

The mat can consist essentially of the plurality of fibers. The resulting continuous piezoelectric film can have at least one piezoelectric constant $d_{31}$ or $d_{33}$ that is at least 1 pC/N.

In another aspect, a piezoelectric component includes a continuous piezoelectric film including a plurality of fibers, each fiber including a polypeptide, where molecules of the polypeptide have electric dipole moments that are aligned such that the piezoelectric fiber provides a piezoelectric effect, and wherein the piezoelectric film has at least one piezoelectric constant $d_{31}$ or $d_{33}$ that is at least 1 pC/N.

In another aspect, an electronic device includes a continuous piezoelectric film. The electronic device can be at least one of a transducer, nanoswitch, cantilever, sensor, actuator, vector sensor, array sensor, microphone, speaker, and an energy harvesting device.

Further objectives and advantages, as well as the structure and function of preferred embodiments will become apparent from a consideration of the description, drawings and examples.

BRIEF DESCRIPTION OF THE DRAWINGS

FIGS. 9a-9c shows charge vs force plots for dynamic piezoelectricity test under $d_{33}$ (FIG. 9a), $d_{14}$ (FIG. 9b), and $d_{31}$ (FIG. 9c) modes.

DETAILED DESCRIPTION

Figure 1:
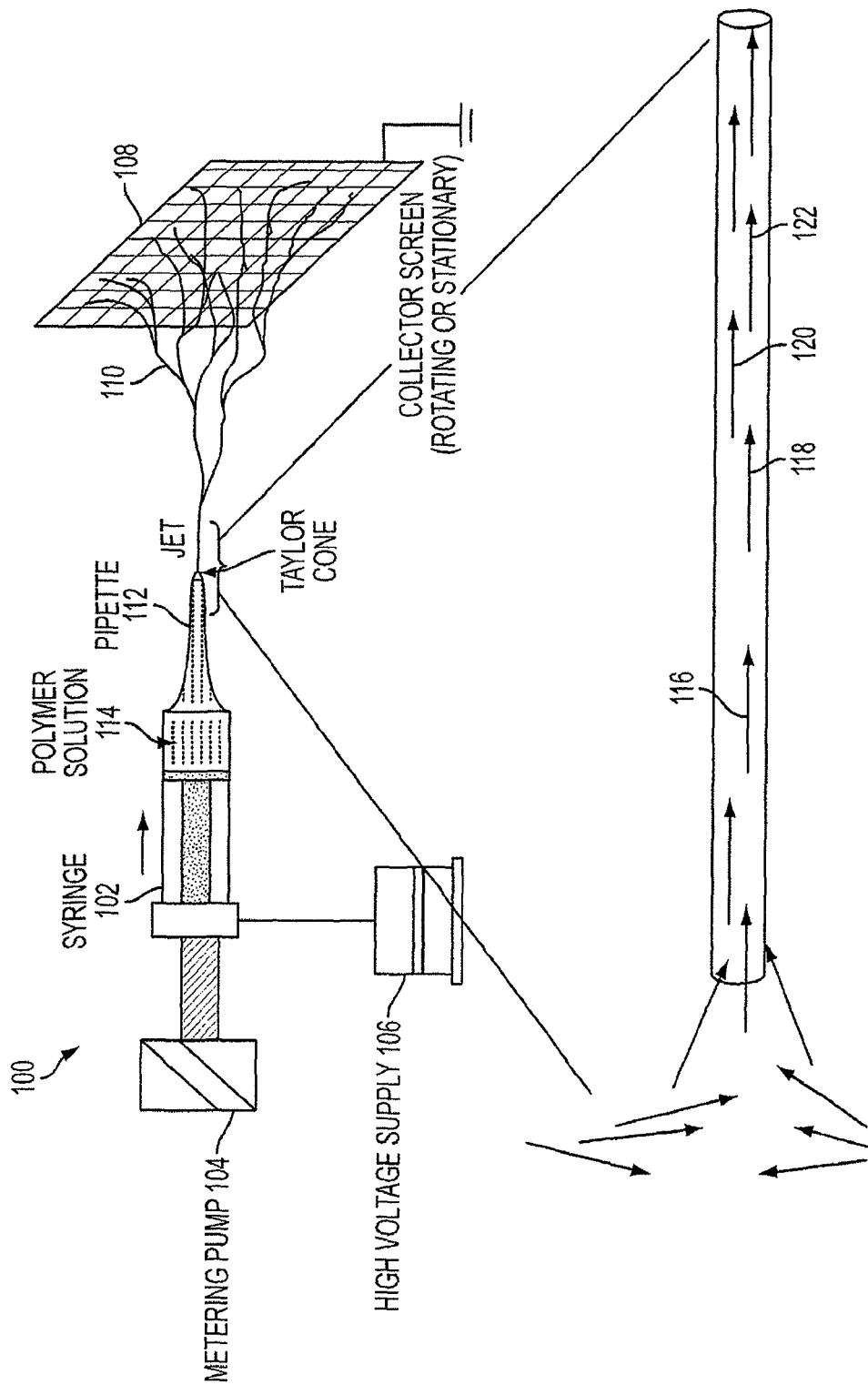
FIG. 1 is a schematic illustration of an electro-spinning process that can be used to produce fibers.

The contents of all cited references (including literature references, issued patents, published patent applications) as cited throughout this application are hereby expressly incorporated by reference.

Some embodiments include a continuous piezoelectric film comprising a plurality of fibers, each fiber including a polypeptide, where molecules of the polypeptide have electric dipole moments that are aligned such that the piezoelectric fiber provides a piezoelectric effect, and wherein the continuous piezoelectric film has at least one piezoelectric constant $d_{31}$ or $d_{33}$ that is at least 1 pC/N.

The investigation of piezoelectricity in natural semicrystalline materials started as early as in 1960s with the study of woods and bones (E. Fukada, J. Phys. Soc. Jpn. 10, 149-154 (1955); E. Fukada, I. Yasuda, J. Phys. Soc. Jpn. 12, 5 (1957)). Since then, the piezoelectricity in various biopolymers including polysaccharides, proteins and polynucleotides has been investigated (E. Fukada, J. Phys. Soc. Jpn. 11, 1301 (1956); V. A. Bazhenov: Piezoelectric Properties of Wood (Consultants Bureau, New York, 1961); and Y. Ando, E. Fukada, J. Polym. Sci. Pol. Phys. 14, 63-79 (1976)) which eventually led to the study of piezoelectricity in synthetic polymers and the discovery of the piezoelectricity in poled PVDF in the 1970s. See, e.g., H. Kawai, Jpn. J. Appl. Phys. 8, 975 (1969); and J. J. G. Bergman, J. H. McFee, G. R. Crane, Appl. Phys. Lett. 18, 203-205 (1971). Among biopolymers, poly(glutamate)s have been a target of intense study because of their well-defined chemical composition and polar helical structure.

Poly(glutamate)s adopt a rigid α-helical conformation in solution and in solids (H. Block, *Poly(γ-benzyl-L-glutamate) and other glutamic acid containing polymers* (Gordon & Breach, New York, 1983)). The poly(glutamate) alpha-helix has 3.5 residues per turn with an axial rise per residue (amino acid) value of 1.5 Å. An alpha-helix is stabilized by internal hydrogen bonds between amide hydrogen (hydrogen donor) and carbonyl oxygen (hydrogen acceptor), aligned in the direction of the helical axis. These hydrogen bonds have the same orientation giving high permanent polarity to the rod-like α-helix. α-helical poly(α-amino acids), which have macroscopic dipoles in the direction of helical axis, can couple synergistically with external electric field and shear force during electrospinning to produce polar fibers (see, e.g., E. Fukada, J. Phys. Soc. Jpn. 11, 1301 (1956); and D. Farrar, K. Ren, D. Cheng, S. Kim, W. Moon, W. L. Wilson, J. E. West, S. M. Yu, Adv. Mater. 23, 3954-3958). Various types of α-helical poly(α-amino acids) have been poled by electrical fields in solution, but maintaining the poled helices in solid state was extremely difficult until the electrospinning method to simultaneously pole and spin polymer fibers was introduced. See, e.g., C. G. Worley, R. W. Linton, E. T. Samulski, Langmuir 11, 3805-3810 (1995); D. Farrar, J. E. West, I. J. Busch-Vishniac, S. M. Yu, Scripta Mater. 59, 1051-1054 (2008); E. Eizuka, Biochim. Biophys. Acta. 175, 457 (1969); Y. C. Chang, C. W. Frank, G. G. Forstmann, D. Johannsmann, J. Chem. Phys. 111, 6136-6143 (1999); and D. Farrar, K. Ren, D. Cheng, S. Kim, W. Moon, W. L. Wilson, J. E. West, S. M. Yu, Adv. Mater. 23, 3954-3958.

As early as 1956, Fukuda and his research group demonstrated piezoelectricity in helical poly(α-amino acids), in particular poly(γ-benzyl-α,L-glutamate) PBLG and other poly (γ-alkyl glutamate) derivatives. They showed that application of a magnetic field or mechanical force to this material in film form can produce uniaxial orientation of the polymer chains. That uniaxial orientation in turn led to a strong piezoelectric property in shear mode, with piezoelectric coefficient $d_{14}$ ranging from 1 to 2 pC/N (Y. Go, S. Ejiri, E. Fukada, BBA-Protein Struct. M. 175, 454-456 (1969); T. Konaga, E. Fukada, J. Polym. Sci. Pol. Phys. 9, 2023 (1971); E. Fukada, T. Furukawa, E. Baer, A. Hiltner, J. M. Anderson, J. Macromol. Sci.-Phys. B 8, 475-481 (1973); T. Furukawa, K. Ogiwara, E. Fukada, J. Polym. Sci. Pol. Phys. 18, 1697-1706 (1980); T. Furukawa, G. E. Johnson, H. E. Bair, Y. Tajitsu, A. Chiba, E. Fukada, Ferroelectrics 32, 61-67 (1981); E. Fukada, Ferroelectrics 60, 285-296 (1984); and T. Nakiri, K. Imoto, M. Ishizuka, S. Okamoto, M. Date, Y. Uematsu, E. Fukada, Y. Tajitsu, Jpn. J. Appl. Phys. 43, 6769-6774 (2004)). Despite attempts by numerous researchers, piezoelectric coefficients in $d_{33}$ and $d_{31}$ mode have not been determined for this material because of inability to fabricate films with all helical dipoles poled in one direction (T. Furukawa, IEEE T Electr. Insul. 24, 375-394 (1989)).

Electrospun polar polymers can be fused to produce polymer films with permanent and unidirectional polarity. First, a solution of polar polymer is electrospun to generate polar fibers with dipole moments aligned parallel to the polymer fiber axis. Then, the electrospun fibers are fused together (e.g., in a hot press) to obtain a continuous film without loss of the polar alignment.

In one embodiment, PBLG films are made with C, symmetry where PBLG helices are poled in parallel fashion. These films can be made with an electrospnning process that preserves the molecular polarity of PBLG in macroscopic polymer fibers, followed by a hot pressing method that fuses the PBLG fibers together to form a continuous film. Piezoelectric coefficients in all $d_{33}$, $d_{31}$, and $d_{14}$ modes were measured, and a full piezoelectric matrix was determined.

As used herein, a "fiber" is a filamentous strand including a plurality of polymer molecules, wherein the length of the fiber is longer than its diameter. A "piezoelectric fiber" is a fiber according to the above definition which exhibits piezoelectric properties.

As used herein, a "film" is a continuous film including a plurality of fibers, where the length and/or width of the film is greater than its thickness. A "piezoelectric film" is a film according to the above definition which exhibits piezoelectric properties.

"Piezoelectric properties" as used herein, describe the ability of the fiber to produce an electric potential in response to an applied mechanic stress, or reversely, to produce mechanical stress and/or strain in response to an applied electric potential.

FIG. 1 provides a schematic illustration of an electro-spinning system 100 that can be used to produce piezoelectric fibers according to an embodiment of the current invention. The electro-spinning system 100 includes a syringe 102, a metering pump 104, a voltage supply 106 and a collector screen 108. The voltage supply can provide high voltages up to several tens of kV in some embodiments of the current invention. For example, voltages up to 30 kV is suitable for some applications. However, some embodiments of the invention are not limited to only a maximum of 30 kV. The collector screen 108 is grounded and, in this example, stationary. With a stationary screen, the fiber 110 will typically collect in a mesh or network of randomly oriented portions of the fiber. The syringe 102 includes a pipette 112 that provides a nozzle for forming piezoelectric fibers. The syringe 102 is loaded with a polypeptide solution 114.

A section of a piezoelectric fiber 116 is illustrated schematically in FIG. 1. Some of the polypeptide molecules that form the piezoelectric fiber 116 are represented by the arrows, such as 118, 120 and 122, for example. More particularly, the arrows, such as 118, 120 and 122, schematically represent electric dipole moments of the constituent polypeptide molecules. The direction of the arrow represents the polarity direction of the dipole moment of the polypeptide molecule. The alignment of the polypeptides is due to the direction of the applied voltage. Polarity reversal will cause the dipoles to change direction. The dipole moments of the polypeptides, such as 118, 120 and 122, are aligned in the piezoelectric fiber 116 substantially along a common direction which is the longitudinal axis of the piezoelectric fiber 116 in this case. Since the dipole moments of the polypeptides are align both in a common direction and in polarity, the piezoelectric fiber 116 exhibit a piezoelectric effect since compressing and/or stretching the piezoelectric fiber 116 produces an electric potential in response to the compressing and/or stretching. One can see that if the arrows 118 and 120, for example, were pointing in opposite directions they would tend to cancel the total dipole moment of the fiber 116 in that region. Consequently, a method of manufacturing piezoelectric fiber 116 seeks to provide conditions for the piezoelectric fiber 116 to substantially solidify prior to being subjected to external fields that could disrupt or randomize the polarity of the constituent polypeptide molecules so that the polarities of the constituent polypeptide molecules are predominantly aligned along a common direction. For example, if fibers are collected on a stationary collector prior to the constituent molecules within the fiber being fixed in a predominant common polarity, the polarities could be randomized, thus resulting in a fiber that does not exhibit a piezoelectric effect.

Figure 2A:
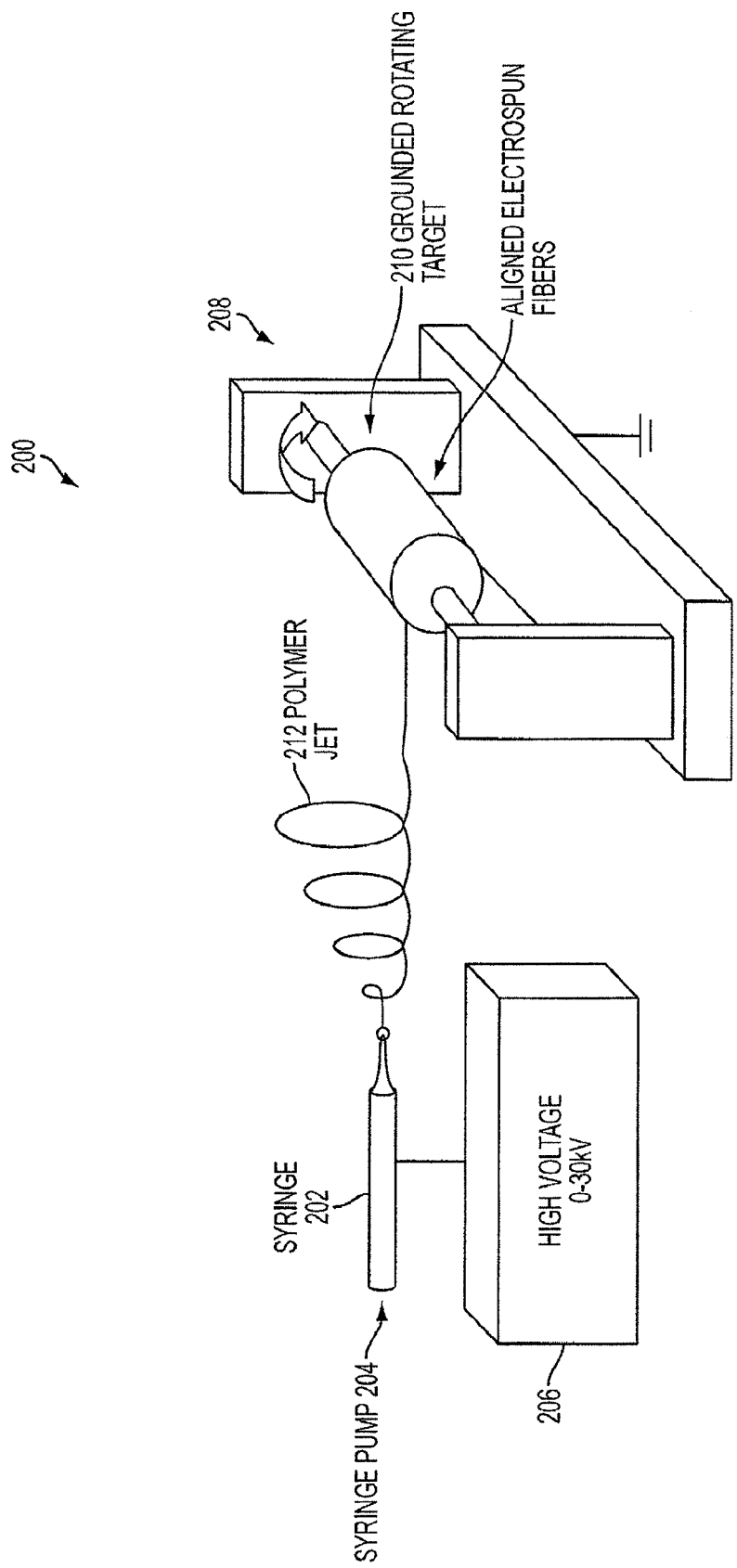
FIG. 2a is a schematic illustration of an electro-spinning apparatus that can be used to produce piezoelectric fibers.

FIG. 2a is a schematic illustration of an electro-spinning system 200 that can be used to produce piezoelectric fibers. The electro-spinning system 200 includes a syringe 202, a syringe pump 204, a voltage supply 206 and a collector system 208. The collector system 208 has a grounded rotating target 210 on which piezoelectric fiber 212 can be wound as it is produced to provide long piezoelectric fibers. In this case, sections of the piezoelectric fiber 212 are substantially parallel to neighboring sections of the piezoelectric fiber 212. See, for example, WO 2010/022158, which is incorporated by reference in its entirety.

Figures 2B, 3:
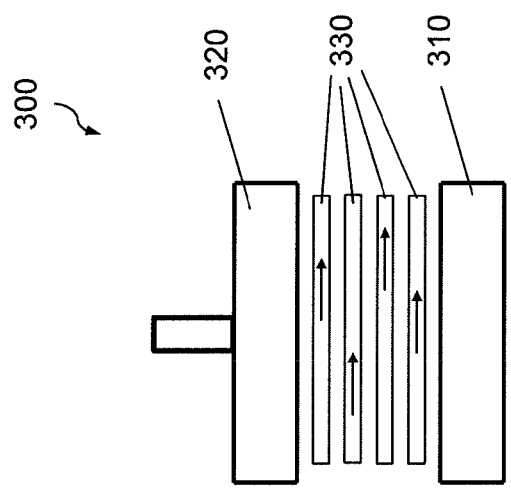
FIG. 2b is a schematic illustration of a hot press apparatus that can be used to produce piezoelectric films.
FIG. 3 shows a schematic depictions of the molecular dipole orientation associated with class I and class II types of piezoelectric polymer systems. Left panel, Class I materials with $C_{\infty v}$ symmetry and dipoles aligned by electric filed. Right panel, Class II materials with $D_\infty$ symmetry and dipoles or chiral molecules aligned by mechanical stretching or magnetic field.

FIG. 2b is a schematic illustration of a hot press apparatus 300 that can be used to produce piezoelectric films from fibers. The hot press apparatus 300 includes first surface 310 and second surface 320 facing first surface 310. The apparatus is configured such that first surface and second surface can compress a material between the surfaces at a desired pressure and at a desired temperature. In operation, a plurality of fibers 330, e.g., piezoelectric fibers, are arranged between first surface 310 and second surface 320. Desirably the plurality of fibers 330 each possess a dipole, and the dipoles of the plurality of fibers are aligned when the fibers are arranged between first surface 310 and second surface 320. As illustrated in FIG. 2b, the fibers can possess a dipole parallel to the fiber axis, and the fiber axes and corresponding dipoles are arranged in a parallel fashion. The press is actuated so as to apply a desired pressure to the plurality of fibers 330 at a desired temperature and for a desired length of time. The pressure, temperature, and time are selected so as to promote fusion of the fibers into a continuous film which has a dipole in the same direction as the aligned dipoles of the precursor fibers.

In some embodiments, the constituent polypeptide molecules have electric dipole moments greater or equal to 35 Debye. In some embodiments, the electric dipole moment of the polypeptide is between 35 and 3000 Debye. In some embodiments, the electric dipole moments of the polypeptide molecules are aligned substantially parallel to the axis of the fiber.

In some embodiments, the piezoelectric fiber can have a diameter as small as about 10 nm. In other embodiments, the diameter of the piezoelectric fiber can be as thick as about 100 µm. In some embodiments, the fiber may be between 100 nm and 50 µm in diameter. In other embodiments, the fiber has a length of at least about 200 nm. In some embodiments, the fiber can be up to 1 mm or more, up to 1 cm or more, or even several meters long. Other embodiments can include combinations of these dimensions and/or other values within the ranges depending on the particular applications. A range of diameters are useful for different applications. For example, for very small actuators very thin fibers have an advantage, on the other hand, for large actuators, thicker fibers are desirable. The diameter and length of the fiber depend on the peptide, the applied field (voltage) and the solvent used.

In some embodiments, the piezoelectric fiber has values for the piezoelectric constants $d_{31}$ and/or $d_{33}$ of at least 1 pC/N. The piezoelectric fiber may have only one of $d_{31}$ or $d_{33}$, or may have both values. In other embodiments, the $d_{31}$ value may be between 10 pC/N and 100 pC/N. In other embodiments, the $d_{33}$ value may be between 10 pC/N to 200 pC/N. In other embodiments, the piezoelectric fibers have both $d_{31}$ and $d_{33}$ values (see descriptions e.g. in U.S. Pat. Nos. 7,101,491 and 7,045,075, each of which is incorporated by reference in its entirety, regarding ceramic piezoelectric materials and their characterizations).

In some embodiments, the piezoelectric film has a value for the piezoelectric constant $d_{14}$, e.g., of at least 0.05 pC/N, or at least 0.1 pC/N. In some embodiments, the piezoelectric film, prepared using the piezoelectric fibers, has values for the piezoelectric constants $d_{31}$ and/or $d_{33}$ of at least 1 pC/N. The piezoelectric film may have only one of $d_{31}$ or $d_{33}$, or may have both values. In other embodiments, the $d_{31}$ value may be between 10 pC/N and 100 pC/N. In other embodiments, the $d_{33}$ value may be between 10 pC/N to 200 pC/N. In other embodiments, the piezoelectric films have both $d_{31}$ and $d_{33}$ values.

In certain embodiments, the piezoelectric fiber and/or piezoelectric film has an operating temperature at or below 60° C. In other embodiments, the operating temperature of the piezoelectric fiber and/or piezoelectric film can be between 4 and 80° C., 4 and 100° C., or 4 and 120° C. In other embodiments, the operating temperature of the piezoelectric fiber and/or piezoelectric film can be between 4 and 60° C. Piezoelectric fibers and/or piezoelectric films exhibit piezoelectric properties at temperatures within this range. In other embodiments, the piezoelectric property of the fiber and/or film is stable up to a temperature of 80° C., 100° C., or 120° C. In these embodiments, the fiber and/or film exhibits a piezoelectric property at temperatures below 120° C.

To exhibit piezoelectric properties the material in question must have a non-.centrosymmetric arrangement of atoms and molecules. This can be achieved, for example, by mechanical or electrical treatment, such as mechanical drawing or poling under electrical field.

Piezoelectric polymers can be categorized into two classes. A schematic drawing of the dipole orientation of the two classes of materials are shown in FIG. 3. Class I materials are mainly those that are poled by high electrical field, and which typically show a symmetry of $C_{\infty v}$. PVDF is a representative material for class I category. The class II materials are those composed of uniaxially oriented chiral molecules, which are most commonly biopolymers macroscopically aligned by mechanical stretching or by magnetic field. Class II materials have $D_\infty$ symmetry. The representative material for class II is α-helical poly(amino acids) (e.g., PBLG) and polyesters with chiral repeat units. See, e.g., T. Furukawa, IEEE T Electr. Insul. 24, 375-394 (1989); and T. Nakiri, M. Okuno, N. Maki, M. Kanasaki, Y. Morimoto, S. Okamoto, M. Ishizuka, K. Fukuda, T. Takaki, and Y. Tajitsu, Jpn. J. Appl. Phys. 44, 7119-7122 (2005).

The piezoelectric property of PVDF arises from the all-trans conformation (β phase) of the polymer backbone with the fluorine atoms located on one side of the polymer chain and the hydrogen atoms on the other side, resulting in a net dipole moment perpendicular to the polymer backbone. Therefore, to achieve strong piezoelectric property from PVDF, the material needs to be poled (e.g., by corona discharge) and mechanically stretched (e.g., by uniaxial or zone stretching). Nylon derivatives and poly(vinylidene cyanide) are similar to PVDF in that electrical poling and mechanical stretching are needed for high piezoelectricity.

In 1969, Fukada investigated the piezoelectric property in α-helical poly(amino acids), in particular poly(glutamate) (Y. Go, S. Ejiri, E. Fukada, BBA-Protein Struct. M. 175, 454-456 (1969). Instead of aligning the helical axis of the polymers (which coincides with the dipole direction) along the thickness direction of the film (as it was commonly done when fabricating piezoelectric films), Fukada chose to align them in the plane of the film using magnetic field or by mechanical stretching. This produced a unique shear piezoelectricity with $d_{14}$ in the order of 1 to 2 pC/N due to the chiral nature of the helical polymer. When films of helical polymers are exposed to shear stress—by application of tensile forces at 45° to the helical axis—-the shear deformation of the helical chains follows the chiral nature of the polymer chains. That results in the development of a new net electrical dipole across the film thickness direction (K. Namiki, R. Hayakawa, Y. Wada, J. Polym. Sci. Pol. Phys. 18, 993-1004 (1980)). Nakiri and Fukada reported that the piezoelectric coefficient $d_{14}$ of this film can be as high as 26 pC/N if polymers are aligned by strong magnetic field (10 Tesla) (T. Nakiri, K. Imoto, M. Ishizuka, S. Okamoto, M. Date, Y. Uematsu, E. Fukada, Y. Tajitsu, Jpn. J. Appl. Phys. 43, 6769-6774 (2004)).

In Fukada's work, the alignment of the PBLG molecules was mainly caused by the interactions between the external magnetic field and the induced magnetic field originating from the electron-rich benzyl side chains. This interaction only causes the chains to align in the direction of the field without preferred directionality: the helices are aligned in random, anti-parallel fashion resulting in crystal symmetry of $D_\infty$/(see FIG. 3, right panel). Therefore, Fukuda and coworkers were able to determine the piezoelectricity only in the shear mode ($d_{14}$), and piezoelectricity of PBLG in either $d_{33}$ or $d_{33}$ modes has not been reported to date (T. Furukawa, IEEE T Electr. Insul. 24, 375-394 (1989)).

In certain embodiments, the polypeptide has a helical structure. In some specific embodiments, the helical structure is an α-helical structure. A helical or α-helical structure stabilizes the secondary structure of the polypeptide, and increases the dipole moment of the polymer material. The rod-like structure of the α-helix results in a unique set of properties including a large anisotropy and high persistence length. Polypeptides containing certain natural and synthetic amino acids spontaneously form helical or α-helical structures. For instance, polymers formed from repeating units of γ-esters of glutamic acid, β-esters of aspartic acid, alanine, phenylalanine, or combinations thereof, will often form α-helical structures. Other amino acids may be used in the polypeptide, so long as the polypeptide has an overall electric dipole moment or an α-helical structure. In general, if circular dichroism (CD) indicates that the polypeptide is not a random coil, the polypeptide can be expected to have an electrical dipole moment. Whether a polypeptide forms an α-helical structure can be readily determined using standard techniques in the art. For example, infrared (IR) analysis or X-ray diffraction may confirm the presence of an α-helical structure in a polypeptide. Another technique for determining the presence of an α-helical structure in a polypeptide includes circular dichroism.

In certain embodiments, the polymer contains repeat units of γ-benzyl-L-glutamate. It has been reported that each repeat unit contributes approximately 3.5 Debye to the total helix dipole.

In certain embodiments, the polypeptide has a degree of polymerization of at least about 20 up to about 3000. In other embodiments, the degree of polymerization of the polypeptide is between 100 and 2000.

As used herein, "γ-esters of glutamic acid" have the structure of glutamic acid, with an ester at the γ-carboxylate. As used herein, "β-esters of aspartic acid" have the structure of aspartic acid, with an ester at the β-carboxylate. The ester may be an alkyl ester, arylalkyl ester, alkenyl ester, alkynyl ester, aryl ester, heteroaryl ester, or heteroarylalkyl ester. In certain embodiments, the ester is an alkyl ester or arylalkyl ester. In some embodiments, the ester is a benzyl ester.

The term "alkyl" as used herein means straight-chain, branched or cyclic $C_1$-$C_{12}$ hydrocarbons which are completely saturated and hybrids thereof such as (cycloalkyl) alkyl. The terms "alkenyl" and "alkynyl" used alone or as part of a larger moiety include both straight and branched chains containing two to twelve carbon atoms. The term "cycloalkyl" used alone or as part of a larger moiety include cyclic $C_3$-$C_{12}$ hydrocarbons which are completely saturated or which contain one or more units of unsaturation, but which are not aromatic.

The term "aryl" used alone or as part of a larger moiety as in "arylalkyl", refers to mono-, bi-, or tricyclic aromatic hydrocarbon ring systems having five to fourteen members, such as phenyl, benzyl, phenethyl, 1-naphthyl, 2-naphthyl, 1-anthracyl and 2-anthracyl. The term "aryl" also refers to rings that are optionally substituted. The term "aryl" may be used interchangeably with the term "aryl ring". "Aryl" also includes fused polycyclic aromatic ring systems in which an aromatic ring is fused to one or more rings. Examples include 1-naphthyl, 2-naphthyl, 1-anthracyl and 2-anthracyl. Also included within the scope of the term "aryl", as it is used herein, is a group in which an aromatic ring is fused to one or more non-aromatic rings, such as in an indanyl, phenanthridinyl or tetrahydronaphthyl, where the radical or point of attachment is on the aromatic ring. The term "arylalkyl" refers to an alkyl group substituted by an aryl. Examples of arylalkyl groups include, but are not limited to, benzyl and phenethyl.

The term "heteroaryl", used alone or as part of a larger moiety as in "heteroarylalkyl", refers to heteroaromatic ring groups having five to fourteen members, preferably five to ten, in which one or more ring carbons, preferably one to four, are each replaced by a heteroatom such as N, O, or S. Examples of heteroaryl rings include 2-furanyl, 3-furanyl, N-imidazolyl, 2-imidazolyl, 4-imidazolyl, 5-imidazolyl, 3-isoxazolyl, 4-isoxazolyl, 5-isoxazolyl, 2-oxadiazolyl, 5-oxadiazolyl, 2-oxazolyl, 4-oxazolyl, 5-oxazolyl, 1-pyrrolyl, 2-pyrrolyl, 3-pyrrolyl, 1-pyrazolyl, 3-pyrazolyl, 4-pyrazolyl, 2-pyridyl, 3-pyridyl, 4-pyridyl, 2-pyrimidyl, 4-pyrimidyl, 5-pyrimidyl, 3-pyridazinyl, 2-thiazolyl, 4-thiazolyl, 5-thiazolyl, 5-tetrazolyl, 2-triazolyl, 5-triazolyl, 2-thienyl, 3-thienyl, carbazolyl, benzimidazolyl, benzothienyl, benzofuranyl, indolyl, quinolinyl, benzotriazolyl, benzothiazolyl, benzooxazolyl, benzimidazolyl, isoquinolinyl, indazolyl, isoindolyl, acridinyl, or benzoisoxazolyl. Also included within the scope of the term "heteroaryl", as it is used herein, is a group in which a heteroaromatic ring is fused to one or more aromatic or nonaromatic rings where the radical or point of attachment is on the heteroaromatic ring. Examples include tetrahydroquinolinyl, tetrahydroisoquinolinyl, and pyrido[3,4-d]pyrimidinyl. The term "heteroaryl" also refers to rings that are optionally substituted. The term "heteroaryl" may be used interchangeably with the term "heteroaryl ring" or the term "heteroaromatic". The term "heteroarylalkyl" refers to an alkyl group substituted by a heteroaryl group.

An aryl (including the aryl moiety in arylalkyl) or heteroaryl (including the heteroaryl moiety in heteroarylalkyl) group may contain one or more substituents. Examples of suitable substituents on the unsaturated carbon atom of an aryl or heteroaryl group include a halogen, —R', —OR', —SR', 1,2-methylene-dioxy, 1,2-ethylenedioxy, protected OH (such as acyloxy), phenyl (Ph), substituted Ph, —O(Ph), substituted —O(Ph), —$CH_2$(Ph), substituted —$CH_2$(Ph), —$CH_2CH_2$(Ph), substituted —$CH_2CH_2$(Ph), —$NO_2$, —CN, —N(R')$_2$, —NR'C(O)R', —NR'C(O)N(R')$_2$, —NR'$CO_2$R', —NR'NR'C(O)R', —NR'NR'C(O)N(R')$_2$, —NR'NR' $CO_2$R', —C(O)C(O)R', —C(O)$CH_2$C(O)R', —$CO_2$R', —C(O)R', —C(O)N(R')$_2$, —OC(O)N(R')$_2$, —S(O)$_2$R', —$SO_2$N(R')$_2$, —S(O)R', —NR'$SO_2$N(R')$_2$, —NR'$SO_2$R', —C(S)N(R')$_2$, —C(NH)N(R')$_2$, wherein each R' is independently selected from hydrogen, a substituted or unsubstituted alkyl, alkenyl, OR alkynyl group, an unsubstituted heteroaryl or heterocyclic ring, phenyl (Ph), substituted Ph, —O(Ph), substituted —O(Ph), —CH₂(Ph), or substituted —CH₂(Ph). Examples of substituents on the aliphatic group or the phenyl ring of R' include amino, alkylamino, dialkylamino, aminocarbonyl, halogen, alkyl, alkylaminocarbonyl, dialkylaminocarbonyl, alkylaminocarbonyloxy, dialkylaminocarbonyloxy, alkoxy, nitro, cyano, carboxy, alkoxycarbonyl, alkylcarbonyl, hydroxy, haloalkoxy, or haloalkyl.

The polypeptides described herein may be prepared by methods known in the art. For example, the polymers may be prepared by ring-opening polymerization of an N-carboxyanhydride (NCA) precursor, initiated by a base or organometallic (e.g., zerovalent nickel) reagent as described by Deming et al. (*Facile synthesis of block copolypeptides of defined architecture*. Nature, 1997. 390: p. 386-389), and illustrated in the scheme below, where R is the side-chain of the amino acid and n is the degree of polymerization.

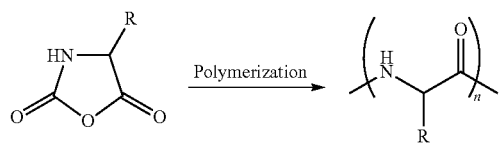

In some embodiments, the piezoelectric fiber and/or piezoelectric film includes a polypeptide other than poly(γ-benzyl-L-glutamate).

Piezoelectric fibers can be prepared by electrospinning a solution of a suitable polypeptide into a fiber. The molecules of the polypeptide have electric dipole moments that are aligned such that the piezoelectric fiber provides a piezoelectric effect at an operating temperature. See, for example, WO 2010/022158. Such polypeptides may be any of the polypeptides described previously.

The method of making a piezoelectric fiber can include electrospinning a polymer solution onto a rotating target. The target rotates around an axis perpendicular to the direction of the polymer solution stream to roll the piezoelectric fiber onto a spool. The target is grounded and a voltage is applied to the polymer solution. The voltage is at least 1 kV. The voltage level depends on the polypeptide and other material parameters. The voltage can be greater than 10 kV. For example, for high molecular weight polypeptides, an increased voltage may be necessary. The target can rotate at a rate of at least 100 rotations per minute (rpm). The rotation speed also depends on the polypeptide and other material parameters. For example, a particular polypeptide may require a faster or slower rotation speed, depending on the specific polypeptide, molecular weight or other parameters.

Electrospinning includes spinning polymer solutions or melts in high electric fields. A schematic of the electrospinning process is shown in FIG. 1. The process is based on the principle that strong electrical forces overcome weaker forces of surface tension in the charged polymer liquid. At certain threshold voltage, a fine charged jet is ejected from the tip of a capillary tube. Subsequently, the jet moves in the direction of the ground plane or opposite voltage potential to the applied electric field and elongates according to external and internal electrical forces.

One possible explanation for how electrospinning produces the fibers such that the electric dipole moments of the polymers are directionally aligned parallel to the fiber axis is based on the hypothesis that the strong electrical field that the polymer is subjected to by the electrospinning condition, in conjunction with the shear force induced by the spinning process, would pole the polymer molecules along the length of the fiber. This creates fibers with electric dipoles directionally aligned parallel to the fiber axis as shown in FIG. 1.

Electrospinning a polymer onto a rotating target as illustrated in FIG. 2 produces fiber strands where the electric dipoles of individual fiber strands are aligned in a non-random fashion. For example, fibers of poly(γ-benzyl-L-glutamate) are random when the substrate is stationary, and aligned when the substrate rotates. The electric dipoles of individual PBLG molecules can be oriented along the fiber axis, and the fibers can possess electroactivity. See WO 2010/022158.

In certain embodiments, one or more piezoelectric fibers may be incorporated into a piezoelectric film. The piezoelectric films may be flat, shaped, or molded. In certain embodiments, the piezoelectric films may be flexible. In certain embodiments, the piezoelectric fibers are oriented parallel to the surface of the piezoelectric film. In other embodiments, the piezoelectric fibers are oriented perpendicular to the surface of the piezoelectric film. In certain embodiments, one more surfaces or edges of the piezoelectric film may be in contact with an electrode or other layer. The thickness of a piezoelectric film ranges from about 5 μm to about 500 μm in some embodiments. In some embodiments, the piezoelectric film has a thickness ranging from about 25 μm to about 100 μm In certain embodiments, a piezoelectric film can be prepared by providing a plurality of piezoelectric fibers, preferably having aligned dipoles, (e.g., aligned with the fiber axis), and fusing the fibers. Fusing of the fibers can be accomplished by subjecting the fibers to a desired pressure and temperature for a desired length of time, e.g., in a hot press.

In some embodiments, the piezoelectric film can include the piezoelectric fibers substantially free of any other material, in other words, no other materials to are added when forming the piezoelectric film from the piezoelectric fibers. In some embodiments, the piezoelectric film can consist essentially of piezoelectric fibers. In other embodiments, one or more additional materials are present in the film. For example, the film can include a matrix in which the piezoelectric fibers are embedded.

Devices that include a continuous piezoelectric film are described. The piezoelectric films can include any of the piezoelectric fibers discussed previously, and may or may not include poly-L-lactic acid and poly(γ-benzyl-L-glutamate) fibers.

The devices may further comprise a matrix polymer. The matrix polymer can be a non-piezoelectric material which provides structural and mechanical support for the piezoelectric fiber. The matrix polymer may be, for example, an organic or silicon-based polymer. In certain embodiments, the matrix polymer is selected from methylmethacrylate (MMA), poly (methylmethacrylate) (PMMA), polyethylene, polyvinylchloride, or poly(1-butene). The matrix polymer can be a silicone elastomer or silicone rubber. The matrix polymer may be a derivative of a poly(acrylate) (e.g., poly(butylacrylate)), or a copolymer thereof. The piezoelectric fibers may be fully encased in the matrix, or the fibers may extrude from the one or more surfaces or edges of the matrix. One or more edges may be in contact with an electrode or other layer.

Devices can include a plurality of aligned fibers fused in a continuous film, or optionally embedded in a matrix to form a film. In certain embodiments, the fibers are oriented parallel to the surface of the matrix, with an electrical connection to the fiber. In such devices, when the elastic matrix is stretched or compressed a voltage is generated. Such an arrangement can be used, for example, in large area transducers for both transmission and reception of sound. In other embodiments, the film may be cut into short aligned pieces, and embedded in a matrix perpendicular to the surface of the matrix to produce a flat sheet. When a weight is placed on the sheet, the device produces a signal relative to the amount of weight. Such a sheet can be used in an acoustic sensor or source (microphone or speaker, for example). This can permit simplified construction of sensor or speaker arrays, for example. In some embodiments, these can be phased arrays.

In some embodiments, the films described herein may be used alone, or may be used in combination with other piezoelectric films. Examples of other piezoelectric films are described in WO 2008/021191 and WO 2010/022158.

Other embodiments include transducers produced from a plurality of aligned fibers fused in a continuous film, or optionally embedded in a matrix to form a film. In some embodiments, large-scale transducers can be produced when the fibers are embedded in polymers with impedance close to that of air for the manufacture of large-scale transducers. In other embodiments, when one or more surfaces are metalized, the transducers may be used to transmit sound, for instance in microphones or speakers. Because piezoelectric microphones do not require external application of a bias voltage, they are particularly well suited for low power and low mass applications. With the high flexibility of the films of the present invention actuators or speakers may be manufactured which can be rolled up for storage or transport, and taped to a solid wall for rapid deployment.

In other embodiments, one or more surfaces of the film may be metalized in discrete regions to produce sensor arrays, where each discrete region functions as a separate sensor. In other embodiments, the film, including the aligned fibers may be transparent. In such applications, the film may be used to manufacture video screens which also function as speakers for display devices such as televisions.

Since the films may be produced in large areas, they may also be used as coatings for submarines, for example. In a passive mode, such a coating would match the submarine acoustic impedance much more closely to that of sea water. In an active mode, such coatings could produce a motion designed to reduce the reflection from a sonar ping or to return a ping indicating a spurious submarine location.

Figure 4:
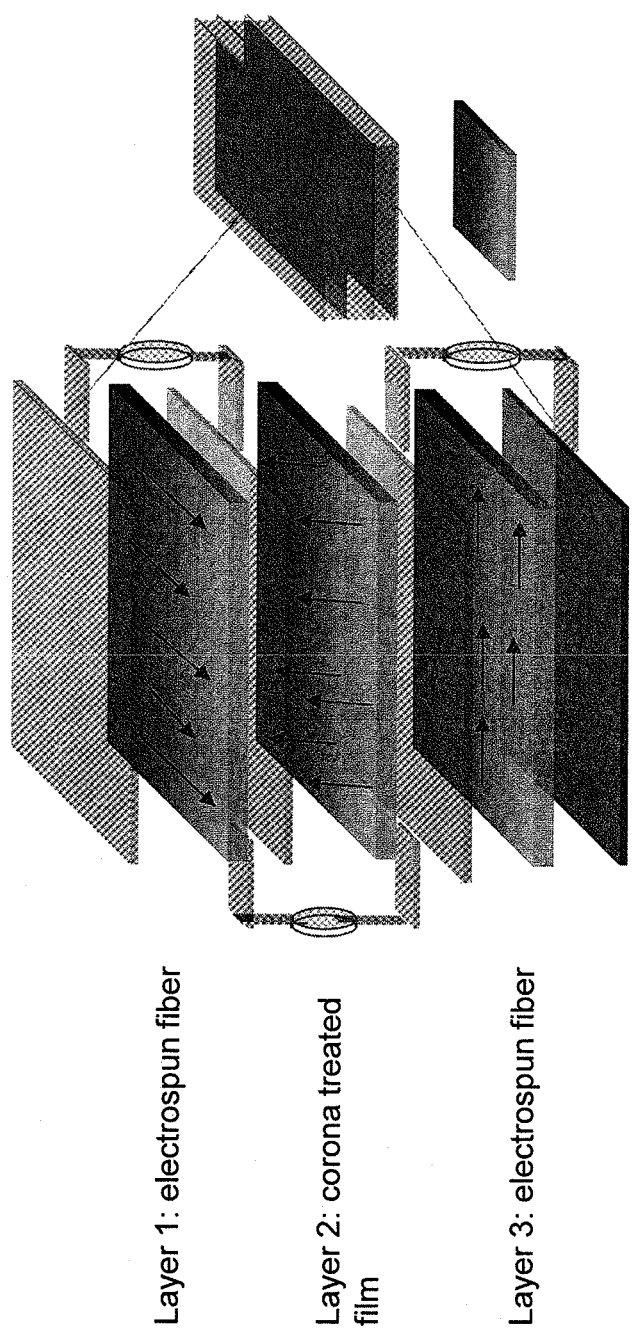
FIG. 4 shows an example of a vector sensor according to an embodiment of the present invention.

Some embodiments include vector sensors comprising a plurality of piezoelectric films in a stack, which are poled in orthogonal directions, wherein at least one film comprises a piezoelectric fiber or piezoelectric fiber composition discussed above. In these devices, each film is provided with a signal collection ability. A diagram of an example of a vector sensor, having three orthogonally aligned films is shown in FIG. 4. In this example, three orthogonally oriented films are provided. The first and third films include piezoelectric fibers oriented parallel to the surface of the film. The second film includes piezoelectric polymers which are oriented perpendicular to the surface of the film. Such films can be produced, for example, by corona poling, as described in WO 2008/021191. The second film may also include fibers aligned perpendicular to the surface of the film. Vector sensors may be used to determine the direction of a sound source by measuring the three vector components of the signal independently. Such devices are particularly suited for use underwater according to some embodiments of the current invention.

Figure 5:
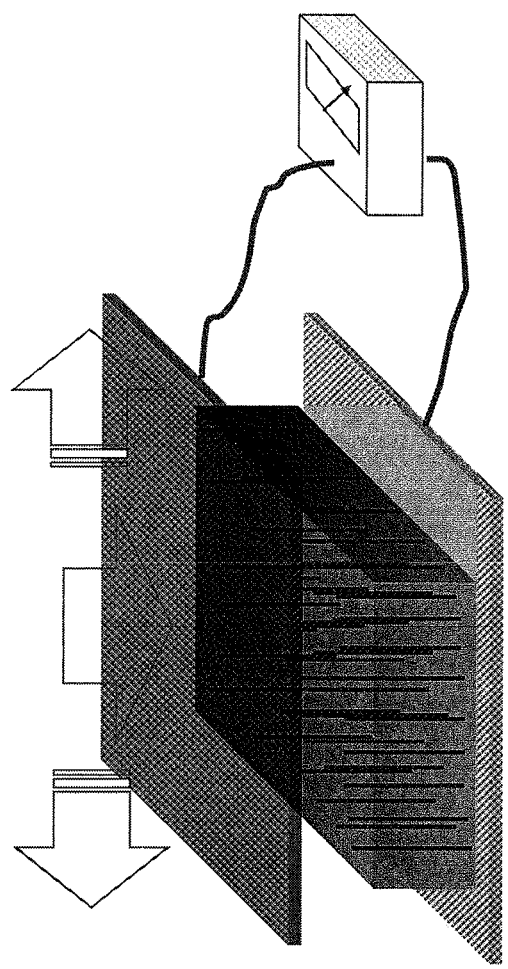
FIG. 5 shows an example of an energy harvesting device according to an embodiment of the present invention.

Other embodiments of the current invention include energy harvesting devices. An example of an energy harvesting device according to an embodiment of the current invention is illustrated schematically in FIG. 5. The energy harvesting device can include aligned fibers fused in a continuous film, or optionally embedded in a matrix to form a film with piezoelectric fibers protruding out of the top surface of the film similar to the cilia on the sensory hair cells in the ear. The matrix may be elastic (such as rubber or other elastic polymer). The bottom side of the film can include an electrode, which may also be flexible. The material of the electrode can be, for example, an electrically conductive polymer composition such as Metal Rubber™, produced by NanoSonic, Inc. On the top side of the film is a metallic surface with undulating topology in contact with the protruding fibers forming a second electrode. Movement of the top electrode due to a sonic wave or mechanical vibration induces a current in the external device. Energy converted from mechanical to electrical form can be collected, stored, or used to power small electronic devices.

The invention and the manner and process of making and using it, are described in such full, clear, concise and exact terms as to enable any person skilled in the art to which it pertains, to make and use the same. It is to be understood that the foregoing describes some embodiments of the present invention and that modifications may be made therein without departing from the spirit or scope of the present invention as set forth in the appended claims.

EXAMPLES

Materials and Methods

Electrospinning. The electrospinning setup consisted of a syringe pump (KD Scientific Inc, Holliston, Mass.), a power supply (Gamma High Voltage Research, Ormond Beach, Fla.) and a custom-made rotating mandrel as shown in FIG. 2. A tuberculin syringe with an AirTite Norm-Ject needle (0.5 inch, 27 G) was loaded with PBLG solution (MW-162,900, 100 mg/mL in dichloromethane). Electrospinning was conducted by applying −12 kV to the needle tip positioned 5 cm away from the grounded rotating mandrel (10 cm diameter, 2,500 rpm) wrapped with an aluminum foil target, while simultaneously pushing the PBLG solution at a 2 mL/hr flow rate using a syringe pump.

Fabrication of Film. The electrospun PBLG fibers were fused into a continuous film using a hot press machine, Wabash G30H-15-BP (Wabash, Ind.). A mat of directionally aligned PBLG fibers was peeled from the aluminum foil target after electrospinning. The mat was loaded on the hot press machine, and 1000 lbs stress was applied for 30 min at 100° C. X-ray diffraction (beam direction perpendicular to film surface) was performed on the PBLG fiber mats before and after the hot pressing using a rotating anode x-ray generator (Rigaku) and Rigaku R-Axis IV++ detector.

SHG microscopy: SHG microscopy was conducted on a Zeiss LMS 510MP equipped with Chameleon titanium sapphire laser (Coherent, Calif.) using 850 nm light pulsed every 150 fs at 45~90 mW. The SHG images were acquired in a backscatter mode through a 395~450 nm band filter. Under these conditions, the optical layer imaged was approximately 800 nm thick.

Dynamic piezoelectricity measurement: For $d_{33}$ measurement, a rectangular shape film with its long axis parallel to the PBLG fiber direction was cut out from the hot pressed PBLG film. Two opposing ends of the long axis of this film were first sputter coated with a 150 nm thick Pt layer followed by application of acrylic adhesive aluminum electrode. One electroded end of the film was attached to a shaker and the other to a load cell fixed to a micro-positioner. The shaker was driven by a piezo amplifier EPA104 (Piezo Systems, MA) and the stress of the fiber bundle was measured by a load cell ELPF-50N-C3006 (Measurement Specialties, VA). The charge generated during the tensile stress was measured by a DSP lock-in amplifier. For $d_{14}$ measurement, rectangular shape film was cut out with its long axis at 45° angle to the PBLG fiber direction. For $d_{31}$ and $d_{14}$ measurement, top and bottom surfaces of the hot pressed film were sputter coated with 150 nm thick Pt electrode.

Results and Discussion

Figure 6:
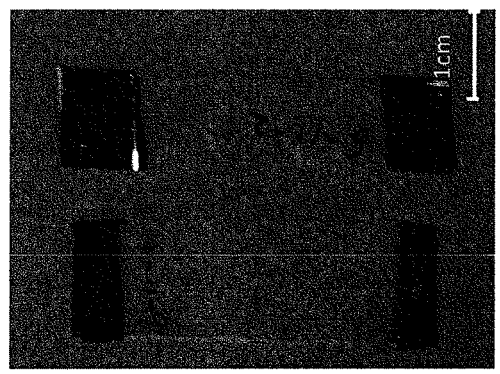
FIG. 6 shows photographs of electrospun PBLG fibers (left) and hot pressed fiber films (right). Both samples are shown with electrodes applied to the two ends of the rectangular shape films for $d_{33}$ test.
Figure 6:
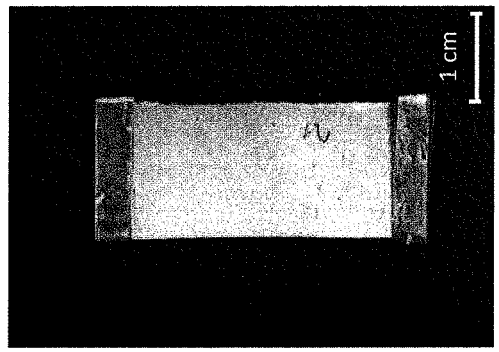

After the hot pressing, the PBLG film appeared as a continuous semi-transparent film with almost no indication of fibrous textures (FIG. 6, right photograph). Since the temperature (100° C.) of the hot pressing process could potentially have caused the PBLG helices to relax from the poled state, we first studied the molecular orientation of the PBLGs in the hot pressed film by X-ray diffraction. The comparative X-ray diffraction patterns (FIG. 7a) indicated that the hot pressing process did not affect the orientation of the poled PBLGs as evidenced by almost identical diffraction patterns for the electrospun fibers before and after the hot pressing. The meridional reflections of 13 Å spacing (FIG. 7a, arrows) which correspond to the inter-molecular distance between PBLG helices clearly remained the same after the hot pressing, although the intensity of the reflection seemed to have slightly diminished (N. S. Murthy, E. T. Samulski, J. R. Knox, Macromolecules 19, 941-942 (1986); and P. J. Campagnola, A. C. Millard, M. Terasaki, P. E. Hoppe, C. J. Malone, W. A. Mohler, Biophys. J. 82, 493-508 (2002). This confirmed the intact α-helical structure as well as the polar orientation of the PBLGs after hot pressing.

Figure 7:
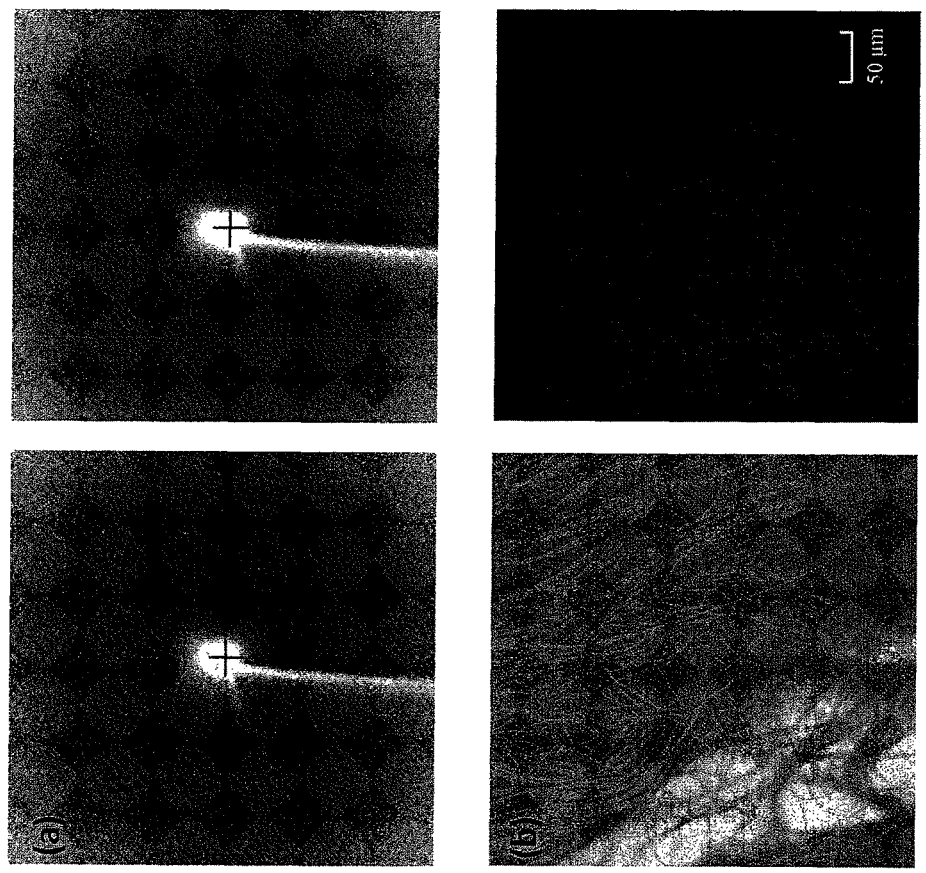
FIGS. 7a-7b show X-ray diffraction patterns (FIG. 7a) and second harmonic generation micrographs (FIG. 7b) of electrospun PBLG fibers (left panels) and hot pressed PBLG films (right panels).

The polar nature of the PBLG film can be also verified from its non-linear optical property. If a polymer with high electron density and with noncentrosymmetric distribution of electrons is illuminated by an intense laser beam, a light corresponding to doubled frequency of the original light is generated [also known as second harmonic generation (SHG)] due to the non-linear optical effect (R. E. Newnham, *Properties of materials: anisotropy, symmetry, structure* (Oxford University Press, New York, December 2004)). SHG is a one of the simplest way to check whether an electron-rich sample is polar and has the potential to exhibit piezoelectric property. FIG. 7b shows the comparative SHG micrographs (epi mode, red color) of the electrospun fibers before (left panel) and after (right panel) hot pressing into continuous film. The extensive red color for both SHG images indicated that the polarity was not lost and we expected strong piezoelectricity from the hot pressed PBLG films as we have seen from the electrospun PBLG fibers (WO 2010/022158). Interestingly, the SHG micrograph of the hot pressed film showed fibrous textures even though such textures were not visible to the eyes. This suggests that the hot press procedure did not fuse the PBLG fibers at a molecular level. Instead, the fibers were superficially bonded together during the hot pressing while maintaining the overall integrity of the original electrospun polymer fibers.

In PBLG, the macroscopic electric dipole originates mainly from the cumulative intra-molecular hydrogen bonds which are pre-aligned along the helical axis. Since PBLG molecules have a strong tendency to orient parallel to various interfaces (M. Fukuto, R. K. Heilmann, P. S. Pershan, S. J. M. Yu, C. M. Soto, and D. A. Tirrell, J. Chem. Phys. 119, 6253-6270 (2003); and S. J. M. Yu, V. P. Conticello, G. H. Zhang, C. Kayser, M. J. Fournier, T. L. Mason, and D. A. Tirrell, Nature 389, 167-170 (1997)), including film surfaces, most piezoelectricity measurements have been made with PBLG's long helical axis in the plane of the film.

Figure 8:
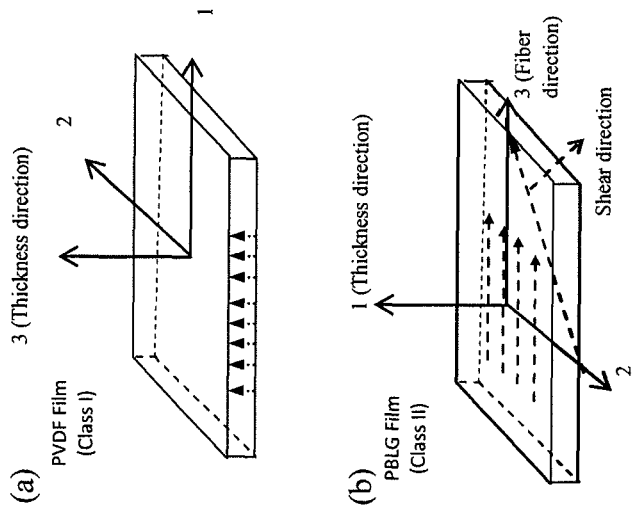
FIG. 8 is a schematic illustration of the definition of coordinates for class I and class II piezoelectric polymer systems.

Therefore, $d_{33}$ is unconventionally defined along the x direction for the PBLG films as oppose to the z (thickness) direction which happens to be a more common convention since most piezoelectric films have dipoles aligned in the thickness direction (FIG. 8). To characterize the piezoelectric property of the hot pressed electrospun PBLG film, the piezoelectric coefficients were measured following the dynamic testing method we reported previously. See D. Farrar, K. Ren, D. Cheng, S. Kim, W. Moon, W. L. Wilson, J. E. West, S. M. Yu, Adv. Mater. 23, 3954-3958; K. Ren, Y. M. Liu, H. Hofmann, Q. M. Zhang, J. Blottman, Appl. Phys. Lett. 91, 3 (2007); and B. Neese, Y. Wang, B. Chu, K. Ren, S. Liu, Q. M. Zhang, C. Huang, J. West, Appl. Phys. Left. 90, 3 (2007).

The constitutive equations for a piezoelectric material can be written as:

$$D_i = \epsilon_{ij}^T E_j + d_{ij} T_j$$

$$S_i = d_{ij} E_j + s_{ij}^E T_j \qquad \text{Eq. 1}$$

where $D_i$ and $T_j$ is the charge density and applied stress on the sample, respectively [29]. In this investigation, we applied the force either along the fiber axis direction or along the shear direction which is at a 45° angle from the fiber axis, depending on the mode of piezoelectric coefficient. The $d_{ij}$ is the piezoelectric coefficient, is the elastic compliance under constant electric field and $\epsilon_{jk}^T$ is the dielectric permittivity under constant stress.

The first equation in Eq. 1 is called the direct piezoelectric effect and the second equation is the converse effect equation. Therefore, the piezoelectric coefficient can be calculated by the following equation:

$$d_{ij} = \left(\frac{\partial D_i}{\partial T_j}\right)_E = \left(\frac{\partial S_i}{\partial T_j}\right)_T \qquad \text{Eq. 2}$$

For comparison, Table 1 shows the reported piezoelectric coefficients of poled PVDF film.

TABLE 1

| Materials (Parameters) | $d_{31}$ (pC/N) | $d_{32}$ (pC/N) | $d_{33}$ (pC/N) | $d_{15}/d_{14}$ (pC/N) | $\epsilon_{33}/\epsilon_0$ | Y ($10^9$ Pa) |
|---|---|---|---|---|---|---|
| PVDF | 28 | 4 | −35 |  | 15 | 2.74 |
| PVDF/TrFE (75/25) | 10.7 | 10.1 |  | 36.6 | 7.9 | 3 |
| Nylon 11 | 0.4 |  | 4 |  |  |  |
| PBLG | 0.1 |  | 20 | 0.5 | 3~4 | 4 |

The crystal structure of the poled PVDF and Nylon films belong to $C_{\infty v}$ (Class I) and the piezoelectric matrix can be expressed as following (Q. M. Zhang, C. Huang, F. Xia, J. Su, Eds: Y. Bar-Cohen, "*Electroactive Polymer (EAP) Actuators as Artificial Muscles*," Vol. 2, (SPIE Press, WA, USA 2004, Chapter 4)):

$$d_{ij} = \begin{pmatrix} 0 & 0 & 0 & 0 & d_{15} & 0 \\ 0 & 0 & 0 & d_{15} & 0 & 0 \\ d_{31} & d_{32} & d_{33} & 0 & 0 & 0 \end{pmatrix} \qquad \text{Eq. 3}$$

The moderately high piezoelectric coefficient, flexibility and easy fabrication process have made PVDF very attractive for use in transducers and energy harvesting devices (K. Ren, Y. M. Liu, H. Hofmann, Q. M. Zhang, J. Blottman, Appl. Phys. Lett. 91, 3 (2007)).

Fukuda's PBLG film was oriented by magnetic field or by mechanical stretching. Bulk films prepared in this fashion have PBLG helices oriented in the plane of the films. In such system, piezoelectricity is only detected in the shear mode ($d_{14}$) due to the chiral nature of the PBLG and no signal is detected in the longitudinal $d_{33}$ mode or thickness $d_{31}$ mode since helices are aligned in anti-parallel fashion ($D_\infty$ symmetry) that negates permanent macroscopic dipole. The piezoelectric matrix of Fukada's PBLG film (class II) can be written as the following:

$$d_{ij} = \begin{pmatrix} 0 & 0 & 0 & d_{14} & 0 & 0 \\ 0 & 0 & 0 & 0 & -d_{14} & 0 \\ 0 & 0 & 0 & 0 & 0 & 0 \end{pmatrix} \quad \text{Eq. 4}$$

In our hot pressed PBLG film, the dipole direction of the PBLG was preserved as the direction of the PBLG fiber axis before the hot compression. This film had $C_{\infty v}$ symmetry and was expected to exhibit piezoelectricity in $d_{33}$ and $d_{31}$ mode in addition to the shear $d_{14}$ mode. Since the dipole direction of the PBLG material was along the fiber axis direction, films were sputter coated with Au electrode on two opposing ends of the PBLG film. The piezoelectric coefficient $d_{33}$ was calculated by the following equation:

$$I_3 = \frac{dD_3}{dt} = d_{33}\frac{dT_3}{dt} = d_{33}\frac{d(T_0\cos(\omega t))}{dt} = dT_0\omega\sin(\omega t) \quad \text{Eq. 5}$$

where $D_3$ and $T_3$ are the charge density and the applied stress on the tips of the film, respectively; $\omega$ is the stress frequency and $I_3$ is the current generated during the stretching process.

Because $I_3$ is a function of the applied stress, $I_3$ can be given by:

$$I_3 = I_0 \sin(\omega t + \phi) \quad \text{Eq. 6}$$

Therefore the piezoelectric coefficient can be expressed as:

$$d_{33} = \frac{I_0}{\omega T_0} \quad \text{Eq. 7}$$

FIGS. 9a-9c show the force vs charge plot in the $d_{33}$ mode. The PBLG film exhibited piezoelectric behavior in the $d_{33}$ mode as evidenced by the linear relationship between the force and the charge. The $d_{33}$ piezoelectric coefficient determined from the slope of this plot was 22 pC/N which was very close to the $d_{33}$ determined directly from the electrospun PBLG fibers (D. Farrar, K. Ren, D. Cheng, S. Kim, W. Moon, W. L. Wilson, J. E. West, S. M. Yu, Adv. Mater. 23, 3954-3958). This result was in line with the X-ray and SHG results that the hot pressing process did not deteriorate the polarity and piezoelectricity of the electrospun PBLG fibers. By combining the electrospinning process with a hot pressing method, smooth piezoelectric PBLG films were produced without any complicated poling and/or film stretching.

In conventional applications, the easiest way to collect charge from piezoelectric film is through the two opposing film surfaces. This way, a large surface area can be covered with electrodes. In the PBLG films, this corresponds to the piezoelectricity in either the $d_{31}$ mode or $d_{14}$ mode. The $d_{14}$ mode was tested following the method of Fukuda and coworkers. A hot pressed PBLG film was cut in a rectangular shape with fiber axis oriented 45° from the two principal axes of the rectangle. After sputter coating the opposing film surfaces with Pt, dynamic tensile stress was applied to the long axis of the rectangular shape sample which induces the shear forces to PBLG molecules due to the 45° angle between PBLG fiber axis and tensile stress direction.

The $d_{14}$ of the piezoelectric film can be expressed as:

$$d_{14} = \frac{D_1}{T_4} = \frac{C_1 V_1 A_c}{A_1 F_4} \quad \text{Eq. 8}$$

where $A_c$ is the area of the cross-section of the film along the fiber direction and $A_1$ is the area of the top and bottom electrodes. The generated charge, $V_1$, was measured by lock-in amplifier. The resulting force vs. charge plot is shown in FIG. 9b. From the slope of the plot, it was found that $d_{14}$ of the hot pressed PBLG film was around 0.5 pC/N. Although relatively small, this value was close to the results from Fukada's original work (Y. Go, S. Ejiri, E. Fukada, BBA-Protein Struct. M. 175, 454-456 (1969)).

The piezoelectricity of the hot pressed film in $d_{31}$ mode was determined similarly by applying tensile force in the direction of the PBLG fiber axes while measuring the charge accumulated on the two opposing film surfaces which were sputter coated with Pt. The equation used in $d_{31}$ calculation is:

$$d_{31} = \frac{D_1}{T_3} = \frac{C_1 V_1 A_3}{A_1 F_3} \quad \text{Eq. 9}$$

As the data of FIG. 9c showed, the $d_{31}$ for PBLG compressed film was around 0.1 pC/N. This small piezoelectricity was expected since the film had the highest stiffness when deformed in the direction of the fiber axis, and also because there is less chance of large scale molecular reorganization needed for piezoelectricity development when helices are simply stretched without shear interactions (K. Namiki, R. Hayakawa, Y. Wada, J. Polym. Sci. Pol. Phys. 18, 993-1004 (1980)). This result demonstrated that even after breaking the symmetry in the plane of the film by forcing PBLGs to align in parallel fashion, the $d_{31}$ remains low.

With the measurement of $d_{33}$, $d_{31}$, and $d_{14}$, the full matrix for the hot pressed PBLG film can be written as:

$$d_{ij} = \begin{pmatrix} 0 & 0 & 0 & d_{14} & 0 & 0 \\ 0 & 0 & 0 & 0 & -d_{14} & 0 \\ d_{31} & d_{32} & d_{33} & 0 & 0 & 0 \end{pmatrix} \quad \text{Eq. 10}$$

At first look, this matrix for the PBLG film looks different from the one for PVDF film shown in Eq. 3; however they are actually the same. Eq. 10 can be transformed into Eq. 3 by a counterclockwise rotation of −90° along y axis (axis labeled 2 in FIG. 8) and then another counterclockwise rotation of −180° along x axis (axis labeled 1 in FIG. 8). This matrix transformation also confirms that the new matrix for the hot pressed PBLG film belongs to the $C_{\infty v}$ group.

The piezoelectric properties showed excellent stability, with no substantial deterioration after being exposed to a temperature of 100° C. for 24 h.

Other embodiments are within the scope of the following claims.

The invention claimed is:

1. A continuous piezoelectric film comprising a plurality of fused fibers, each fiber including a polypeptide, wherein molecules of the polypeptide have electric dipole moments that are aligned such that the piezoelectric fiber provides a piezoelectric effect, and wherein the continuous piezoelectric film has at least one piezoelectric constant $d_{31}$ or $d_{33}$ that is at least 1 pC/N.

2. The continuous piezoelectric film of claim 1, wherein the electric dipole moments are aligned parallel to the axis of the fiber.

3. The continuous piezoelectric film of claim 1, wherein the plurality of fibers are aligned in parallel.

4. The continuous piezoelectric film of claim 1, wherein the continuous piezoelectric film has $C_{\infty v}$ symmetry.

5. The continuous piezoelectric film of claim 1, wherein the continuous piezoelectric film consists essentially of the plurality of fibers.

6. The continuous piezoelectric film of claim 1, wherein the piezoelectric film has at least one piezoelectric constant $d_{31}$ and $d_{33}$ that is at least 10 pC/N.

7. The continuous piezoelectric film of claim 1, wherein the piezoelectric film has an operating temperature in the range of about 4° C. to 80° C.

8. The continuous piezoelectric film of claim 1, wherein the polypeptide has a helical structure.

9. The continuous piezoelectric film of claim 1, wherein the polypeptide includes repeating residues of γ-esters of glutamic acid, β-esters of aspartic acid, alanine, phenylalanine, or combinations thereof.

10. A piezoelectric component comprising a continuous piezoelectric film including a plurality of fused fibers, each fiber including a polypeptide, wherein molecules of the polypeptide have electric dipole moments that are aligned such that the piezoelectric fiber provides a piezoelectric effect, and wherein the piezoelectric film has at least one piezoelectric constant $d_{31}$ or $d_{33}$ that is at least 1 pC/N.

11. An electronic device comprising a continuous piezoelectric film according to claim 1.

12. An electronic device according to claim 11, wherein the electronic device is at least one of a transducer, nanoswitch, cantilever, sensor, actuator, vector sensor, array sensor, microphone, speaker, and an energy harvesting device.

* * * * *